United States Patent [19]

Oda et al.

[11] Patent Number: 4,822,645

[45] Date of Patent: Apr. 18, 1989

[54] METALLIZING PASTE AND A PROCESS FOR METALLIZING CERAMIC ARTICLES BY USING SUCH A METALLIZING PASTE

[75] Inventors: Isao Oda; Minoru Matsui, both of Nagoya; Nobuo Tsuno, Kasugai, all of Japan

[73] Assignee: NGK Insulators, Ltd., Nagoya, Japan

[21] Appl. No.: 105,225

[22] Filed: Oct. 7, 1987

[30] Foreign Application Priority Data

Oct. 21, 1986 [JP] Japan ................................ 61-248342

[51] Int. Cl.$^4$ ............................ B05D 5/02; B22F 1/00
[52] U.S. Cl. .................... 427/376.3; 75/252; 106/1.12; 427/96; 427/108; 427/123; 427/126.2; 427/126.4; 427/377
[58] Field of Search ............. 427/108, 96, 229, 376.3, 427/126.4, 126.2, 123, 377; 106/1.12; 75/252

[56] References Cited

U.S. PATENT DOCUMENTS

| | | | |
|---|---|---|---|
| 3,023,492 | 3/1962 | Bristow | 427/123 |
| 3,347,704 | 10/1967 | Meyer | 427/229 |
| 3,403,043 | 9/1968 | Thompson | 427/226 |
| 3,590,468 | 7/1971 | Buck | 427/229 |
| 3,620,799 | 11/1971 | Hoelscher | 75/252 |
| 4,485,150 | 11/1984 | Tsuno | 428/252 |

*Primary Examiner*—Janyce Bell
*Attorney, Agent, or Firm*—Parkhurst, Oliff & Berridge

[57] ABSTRACT

Metallizing pastes are disclosed, which contain, as inorganic materials, 15 to 50% by weight of a component to form a glass phase and 50 to 85% by weight of a metallic molybdenum powder. The glass phase essentially consists of 5 to 25% by weight of $Al_2O_3$, 35 to 55% by weight of $SiO_2$ and 30 to 55% by weight of MnO. A process for metallizing ceramic members is also disclosed. The metallizing paste is applied to surfaces of the ceramic member and the dried. The ceramic member with the dried metallizing paste is then fired in a temperature range from 1,200° to 1,400° C. for 0.5 to 10 hours in a mixed gas of hydrogen gas and nitrogen gas in which a ratio in partial pressure between steam and hydrogen, ($P_{H_2O}/P_{H_2}$), is adjusted in a range from $10^{-6}$ to $10^0$.

11 Claims, 1 Drawing Sheet

METALLIZING PASTE AND A PROCESS FOR METALLIZING CERAMIC ARTICLES BY USING SUCH A METALLIZING PASTE

BACKGROUND OF THE INVENTION (1) Field of the Invention

The present invention relates to a metallizing paste and a process for metallizing ceramic articles by using such a metallizing paste. More particularly, the invention relates to a paste to be used for depositing metallic layers on surfaces of ceramic articles and a process for depositing such metallic layers on the surfaces of the ceramic articles by using that paste. (2) Related Art Statement Although ceramics have excellent properties such as high heat resistance, oxidation resistance, high hardness, etc., they have a shortcoming that they are relatively weak against mechanical and thermal shock due to their poor toughness. In order to compensate for the above shortcoming, a technique in which ceramic materials are used in combination with metallic materials is employed. For this purpose, as one of the techniques for combining ceramic materials with metals, there is known a process in which a layer of a high melting point metal such as metallic molybdenum or metallic tungsten is deposited onto a surface of a ceramic member (corresponding to a metallizing treatment in the present invention), and the ceramic member is bonded to a metallic member through the thus formed metallic layer. In order to deposit metallic layers onto ceramic articles, there is known a technique in which a mixed powder of metallic molybdenum and metallic manganese, or the like is applied onto the surface of a ceramic article and then the applied mixed powder is baked thereon (so-called high melting point metal depositing process or Telefunken process). However, with the recent increasing necessity of applying ceramic materials to mechanical parts, appearance of a metallizing paste giving rise to a greater bonding strength between a ceramic member and a metallic layer formed on the surface of the ceramic member has been earnestly desired. However, since the conventional metallizing pastes have been developed to metallize ceramic articles for semiconductor integrated circuits, ceramic members used in electronic circuit boards or electronic tube exterior devices, such metallizing pastes have defects that bonding strength between the metallic layers and the ceramic members are not necessarily sufficient.

SUMMARY OF THE INVENTION

It is a first object of the present invention to provide a metallizing paste giving rise to a greater bonding strength between ceramic members and metallic layers formed on the surfaces of the ceramic members.

It is a second object of the present invention to provide a process for forming a metallic layer firmly adhered to the surface of the ceramic member by metallizing the surface of the ceramic member with use of such a metallizing paste.

According to a first aspect of the present invention, there is provided a metallizing paste containing, as inorganic materials, 15 to 50% by weight of a component to form a glass phase composed of 5 to 25% by weight of $Al_2O_3$, 35 to 55% by weight of $SiO_2$ and 30 to 55% by weight of MnO, and 50 to 85% by weight of a metallic molybdenum powder.

According to a second aspect of the present invention, there is provided a process for metallizing ceramic articles, which comprises the following steps:

(1) To a surface of the ceramic member is coated a metallizing paste containing, as inorganic materials, 15 to 50% by weight of a component to form a glass phase composed of 5 to 25% by weight of $Al_2O_3$, 35 to 55% by weight of $SiO_2$ and 30 to 55% by weight of MnO, and 50 to 85% by weight of a metallic molybdenum powder.

(2) The metallizing paste applied onto the surface of the ceramic member is dried.

(3) The ceramic member having the dried metallizing paste on its surface is fired at a temperature range from 1,200° to 1,400° C. for 0.5 to 10 hours in a mixed gas of hydrogen and nitrogen in which a ratio in partial pressure between steam and hydrogen, $(P_{H_2O}/P_{H_2})$, is adjusted in a range from $10^{-6}$ to $10^0$.

(4) The ceramic member heated in the above temperature range is cooled to room temperature.

These and other objects, features and advantages of the invention will be appreciated upon reading of the following description of the invention when taken in conjunction with the attached drawing, with the understanding that some modifications, variations and changes of the same could be made by the skilled person in the art to which the invention pertains without departing from the spirit of the invention or the scope of claims appended hereto.

BRIEF DESCRIPTION OF THE DRAWING

For a better understanding of the invention, reference is made to the attached drawing, wherein.

DETAILED DESCRIPTION OF THE INVENTION

Figure 1:
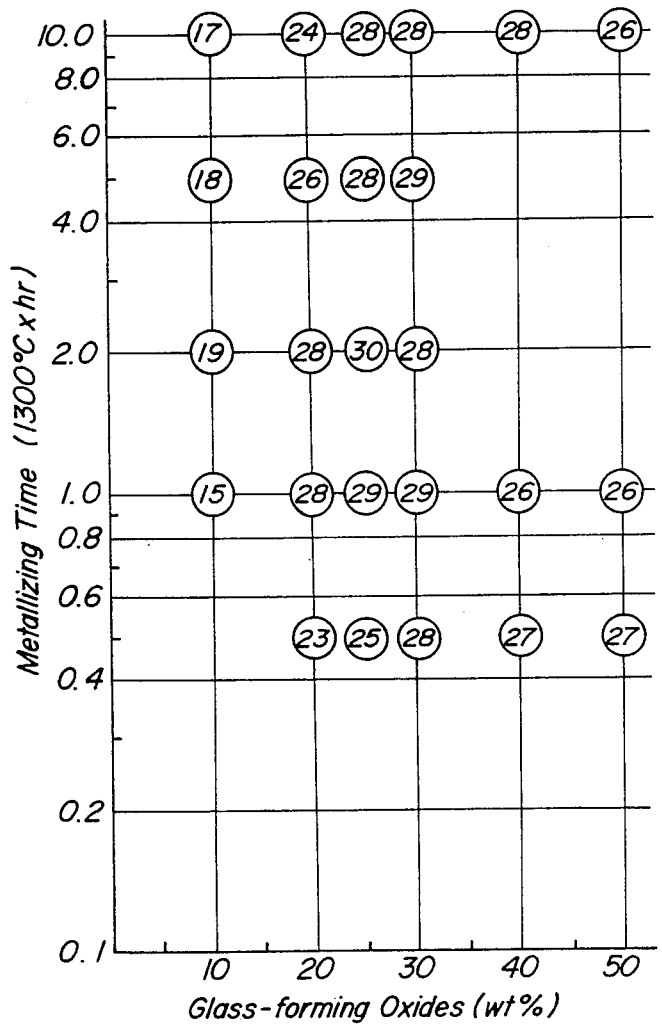
FIG. 1 is a diagram illustrating a relation among an addition amount of glass phase-forming oxides relative to a total amount of inorganic materials contained in a metallizing paste, a metallizing time, and a bonding strength.

The present invention is based on the following consideration and acknowledgment.

That is, when a component forming a glass phase (referred to herein as "glass phase-forming component") which becomes a liquid phase at a temperature substantially equal to a temperature at which the metallic molybdenum powder begins to be sintered is included in the metallizing paste and the metallizing treatment is performed at a temperature not less than a melting point of the glass phase to make the members of the glass phase-forming component react with one another, a liquid glass phase is formed in the metallizing layer. Consequently, the sintering of the metallic molybdenum is promoted by the thus formed liquid glass phase, voids in the sintered molybdenum layer are filled with the liquid phase, and the metallizing layer easily reacts with the surface of the ceramic member. Thereby, the metallic molybdenum layer can firmly be deposited onto the surface of the ceramic member.

Since the voids existing in the molybdenum layer are filled with the glass phase, the strength of the metallizing layer itself can be expected to be improved.

Bearing the above in mind, the present inventors had made various investigations on various glass-phase forming members. That is, as evident from a phase diagram of $MnO-Al_2O_3-SiO_2$ system shown in FIG. 733 of "Phase Diagrams for Ceramics" published by The American Ceramic Society, the $MnO-Al_2O_3-SiO_2$ system has a composition area in which a liquid phase is formed in a temperature range not more than 1300° C. The present invention has been accomplished by making extensive and detailed investigations on influences of compositions of the $MnO-Al_2O_3-SiO_2$ system oxides and an addition amount of the oxides to the metallizing paste upon the bonding strength between the ceramic member and the metallizing layer deposited on the surface of the ceramic member.

The metallizing paste according to the present invention contains a component, which forms a glass phase of $MnO-Al_2O_3-SiO_2$ system having a low melting point, in the metallizing paste as inorganic materials. In order to form the glass phase having the low melting point, the amount of $Al_2O_3$ is 5 to 25% by weight, preferably 8 to 20% by weight, and more preferably 9 to 18% by weight. $Al_2O_3$ is unfavorably less than 5% by weight or more than 25% by weight, because the melting point of the glass phase becomes too high. Further, the amount of $SiO_2$ forming the glass phase is 35 to 55% by weight, preferably 40 to 50% by weight, and more preferably 40 to 46% by weight. $SiO_2$ is unfavorably less than 35% by weight or more than 55% by weight, because the melting point of the glass phase becomes too high.

Further, the amount of MnO is 30 to 55% by weight, preferably 35 to 50% by weight, and more preferably 38 to 50% by weight. MnO is unfavorably less than 30 or more than 55% by weight, because the melting point of the glass phase becomes too high.

A rate of the glass phase-forming component contained in the metallizing paste is 15 to 50% by weight, preferably 20 to 40% by weight, more preferably 20% to 30% by weight as the inorganic materials. The addition amount of the glass phase-forming component relative to the inorganic materials in the metallizing paste is unfavorably less than 15% by weight or more than 50% by weight, because the bonding strength between the ceramic member and the metallic layer (the metallizing layer) formed on the surface of the ceramic member through the metallizing treatment lowers.

It is preferable that the starting-material component to form the glass phase essentially consisting of $Al_2O_3$, $SiO_2$ and MnO is powders of $Al_2O_3$, and $SiO_2$, and metallic manganese.

According to the metallizing paste of the present invention, it may be that MnO as one of the glass phase-forming components is added to the metallizing paste in the form of metallic manganese and the metallic manganese added is converted to MnO by heating during the metallizing treatment. In this case, the metallic manganese only is oxidized to MnO by adjusting the partial pressure of steam in a heating atmosphere in a specific range.

The range of the partial pressure of steam is $10^{-6}$ to $10°$, preferably $10^{-4}$ to $10°$, and more preferably $10^{-4}$ to $10^{-1}$ with respect to a ratio between steam and hydrogen, $(P_{H2O}/P_{H2})$. The ratio in the partial pressure between steam and hydrogen, $(P_{H2O}/P_{2O}/P_{H2}$ is unfavorably less than $10^{-6}$, because MnO is reduced to Mn. The ratio in the partial pressure between steam and hydrogen, $(P_{H2O}/P_{H2})$, is also unfavorably more than $10°$ because metallic molybdenum is oxidized to $MoO_2$.

The molar ratio is of the hydrogen gas to the nitrogen gas in the mixed gas is preferably in the range from 1 to 3.

The metallizing paste according to the present invention contains various solvents and various organic materials such as a binder in addition to the inorganic materials of the above glass phase-forming component and metallic molybdenum as a main component. However, since these organic materials are evaporated or decomposed during the metallizing treatment, they do not remain in the metallizing layer. Therefore, among the starting materials used for producing the metallizing paste, it is the inorganic materials only that influence the physical properties of the metallizing layer. Among the inorganic materials, the members of the glass phase-forming component react with one another during the metallizing treatment to form a liquid glass phase different from the starting materials. Thus, the influences which are imparted by the state of the starting materials upon the properties of the metallizing phase is small. To the contrary, since the metallic molybdenum forms the metallizing layer only through sintering, the properties of its starting material greatly influences those of the metallizing layer. Therefore, it is preferable that metallic molybdenum used for the production of the metallizing paste according to the present invention has a purity of not less than 99.5% by weight. The average grain size is preferably 0.65±0.1 μm, and more preferably 0.65±0.05 μm.

When the metallizing treatment is to be performed by using the metallizing paste according to the present invention, the metallizing paste of the invention is applied onto the surface of a ceramic member in a thickness from 10 μm to 100 μm by using a brush or a screen, and dried. Thereafter, the paste-coated ceramic member is heated in a mixed gas of hydrogen and nitrogen in which the partial pressure of steam is adjusted in the above-mentioned range.

In this case, the heating temperature is 1,200° C. to 1,400° C., and preferably 1,250° to 1,350° C. The heating temperature is unfavorably less than 1,200° C. ecause the viscosity of the glass phase formed in the metallizing layer is too large and metallic molybdenum is insufficiently sintered. The heating temperature is also unfavorably more than 1,400° C., because the quality of the ceramic member varies, for instance, the crystalline grains becomes larger. In the above temperature range, the heating time is 0.5 to 10 hours, and preferably 1 to 5 hours. The heating time is unfavorably less than 0.5 hour, because the bonding strength between the metallizing layer and the ceramic member is small, while the heating time is also unfavorably more than 10 hours because the bonding strength is no longer improved even it exceeds 10 hours.

Next, examples of the present invention will be explained. However, ceramic materials to which the metallizing paste according to the present invention may be applied are not limited to the one exemplified here.

EXAMPLE 1

A metallizing paste containing 20% by weight of a composition to form oxides shown in Table 1 and 80% by weight of metallic molybdenum as inorganic components was prepared. The thus obtained paste was applied to opposite surfaces of a zirconia ceramic round disc having a diameter of 10 mm and a thickness of 10 mm in a film thickness of about 0.1 mm, which was dried by heating at about 90° C. for one hour and heated at 1,300° C. for 10 hours in a mixed gas of hydrogen and nitrogen having passed through a water pool heat at 40° C., thereby forming a metallizing layer on the surfaces of the zirconia ceramic round disc.

In order to measure a bonding strength between the metallizing layer and the zirconia ceramic disc, nickel was plated on each of the surfaces of the metallizing layers and then a nodular graphite cast iron round bar having a diameter of 10 mm and a length of 40 mm was brazed thereto in a vacuum, thereby integrally bonding the ceramic disc and the cast iron round bars. The thus obtained composite product was machined as a rod-like test piece having a diameter of 9 mm and a length of 90 mm, and a bonding strength was determined by a tensile test. Results obtained were shown in Table 1. For comparison purpose, bonding strengths were measured with respect to metallizing pastes of compositions falling outsides the numerical limitations in the present invention, and were also shown in Table 1 as reference Examples.

TABLE 1

| | No. | Oxide composition (wt %) | | | Bonding strength (kgf/mm$^2$) |
| --- | --- | --- | --- | --- | --- |
| | | Al$_2$O$_3$ | SiO$_2$ | MnO | |
| Present invention | 1 | 10 | 45 | 45 | 26 |
| | 2 | 15 | 50 | 35 | 22 |
| | 3 | 20 | 50 | 30 | 23 |
| | 4 | 8 | 52 | 40 | 18 |
| | 5 | 8 | 42 | 50 | 17 |
| | 6 | 15 | 52 | 33 | 19 |
| | 7 | 15 | 38 | 47 | 16 |
| | 8 | 22 | 38 | 40 | 16 |
| Reference example | 11 | 5 | 60 | 35 | 7 |
| | 12 | 5 | 30 | 65 | 5 |
| | 13 | 25 | 60 | 15 | 6 |
| | 14 | 25 | 30 | 45 | 4 |
| | 15 | 30 | 45 | 25 | 5 |

EXAMPLE 2

A metallizing paste containing 10 to 50% by weight of the same composition to form the oxides as in No. 1 of Table 1 and the balance being powdery metallic molybdenum was prepared. The thus obtained paste was coated onto opposite surfaces of a zirconia ceramic round disc having a diameter of 10 mm and a thickness of 10 mm in a film thickness of about 0.1 mm, which was dried by heating at about 90° C. for one hour and heated at 1,300° C. for a time period from 0.5 hour to 10 hours in a mixture of hydrogen gas and nitrogen gas having passed through a water pool heated at 40° C., thereby forming a metallizing layer on the surfaces of the zirconia ceramic round disc. Nickel was plated on each of the surfaces of the metallizing layers, and a metallic titanium round disc having a diameter of 10 mm and a thickness of 3 mm and a nodular graphite cast iron round rod having a diameter of 10 mm and a length of 37 mm were put thereto through silver solder between the metallizing layer and the titanium disc and between the titanium disc and the cast iron rod in this order. After that, they were integrally bonded in vacuum. The thus bonded product was machined as a rod-like test piece having a diameter of 9 mm and a length of 90 mm, and a bonding strength was determined by a tensile test. Results obtained were shown in Table 2. The results shown in Table 2 were plotted in FIG. 1 in which an addition amount of glass phase-forming oxides and a metallizing time were taken in an abscissa and an ordinate, respectively. Figures in circles of FIG. 1 denote bonding strengths.

As evident from FIG. 1, high strength can be obtained when the addition amount of the glass-phase forming oxides with respect to the organic materials in the paste is 15 to 50% by weight and the metallizing time is from 0.5 to 10 hours. Particularly when the addition amount of the glass phase-forming oxides is from 20 to 35% by weight and the metallizing time is from 1 to 10 hours, best results can be obtained.

TABLE 2

| Addition amount of oxides (wt %) | Metallizing time (hr) | | | | |
| --- | --- | --- | --- | --- | --- |
| | 0.5 | 1 | 2 | 5 | 10 |
| 10 | — | 15.0 | 19.0 | 17.8 | 17.3 |
| 20 | 23.1 | 27.9 | 28.4 | 26.0 | 25.3 |
| 25 | 25.4 | 28.4 | 29.6 | 28.3 | 28.5 |
| 30 | 28.4 | 29.0 | 28.3 | 28.6 | 27.6 |
| 40 | 27.3 | 27.6 | — | — | 27.6 |
| 50 | 26.3 | 26.5 | — | — | 25.5 |

(unit: kgf/mm$^2$, n = 5)

As evident from the foregoing, since the low melting point Al$_2$O$_3$-SiO$_2$-MnO system glass phase-forming component which becomes a liquid phase at a temperature substantially equal to the sintering-beginning temperature of metallic molybdenum powder is preliminarily included in the metallizing paste according to the present invention, the liquid glass phase produced through mutual reaction among the members of the glass phase-forming component when the metallizing treatment is carried out at a temperature not less than the melting point of the glass phase promotes the sintering of the metallic molybdenum and fills voids in the sintered molybdenum layer. At the same time, the liquid glass phase makes the reaction between the metallizing layer and the surface of the ceramic member easier so that the metallic molybdenum layer may be firmly deposited onto the surface of the ceramic member.

Therefore, since ceramics which are to undergo the metallizing treatment with the paste according to the present invention can be selected by noting only the ceramic materials themselves and reactivity between the ceramic materials and the above Al$_2$O$_3$-SiO$_2$MnO system glass phase or oxides forming the glass phase, there is no need to add a special component to facilitate the metallizing of the ceramic members.

For this reason, the metallizing paste according to the present invention makes it possible to firmly deposit the metallizing layer onto the high purity ceramic materials such as fine ceramics.

Furthermore, the metallizing temperature in the ceramics-metallizing treatment using the metallizing paste according to the present invention is 1,200° to 1,400° C. which is lower as compared with the conventional metallizing treatment. Thus, since neither changes in properties nor the deformation of the ceramic materials occur with the metallizing treatment, the metallizing paste according to the present invention is also effective in firmly depositing the metallizing layer upon ceramic members having precise or complicated shapes.

The metallizing layer obtained by using the metallizing paste according to the present invention not only has a greater bonding strength upon the ceramic surface, but also the strength of the metallizing layer itself is improved. Thus, the ceramic members bonded to the metallic members through the metallizing layers obtained from the metallizing paste according to the present invention can be used as gas turbine parts, and a part of internal combustion engine parts which undergo high temperatures, repeated loads and impact loads, such as a part of pistons, tappets, intake valves, exhaust valves, turbochargers, rocker arms, cams, etc.

What is claimed is:

1. A metallizing paste containing, as inorganic materials, 15 to 50% by weight of a component to form a glass phase consisting essentially of 5 to 25% by weight of $Al_2O_3$, 35 to 55% by weight of $SiO_2$, and 30 to 55% by weight of MnO, and 50 to 85% by weight of metallic molybdenum having a purity of not less than 99.5% by weight and an average particle size of $0.65\pm0.1$ $\mu$m.

2. A metallizing paste according to claim 1, wherein a melting point of a glass phase formed by said component is from 1,140° to 1,300° C.

3. A metallizing paste according to claim 1, wherein said component to form the glass phase consisting essentially of $Al_2O_3$, $SiO_2$ and MnO is substantially composed of powders of $Al_2O_3$, $SiO_2$ and metallic manganese.

4. A process for metallizing ceramic articles, which comprises the steps of:
   (1) applying, to a surface of a ceramic member, a metallizing paste containing, as inorganic materials, 15 to 50% by weight of a component to form a glass phase consisting essentially of 5 to 25% by weight of $Al_2O_3$, 35 to 55% by weight of $SiO_2$ and 30 to 55% by weight of MnO, and 50 to 85% by weight of metallic molybdenum powder having a purity of not less than 99.5% by weight and an average particle size of $0.65\pm0.1$ $\mu$m;
   (2) drying the metallizing paste applied onto the surface of the ceramic member;
   (3) heating the ceramic member having the dried metallized paste on the surface thereof at a temperature range from 1,200° to 1,400° C. for 0.5 to 10 hours in a mixed gas of hydrogen gas and nitrogen gas in which a ratio in partial pressure between steam and hydrogen, $(PH_2O/PH_2)$, is adjusted to be in range of $10^{-6}$ to $10^0$; and
   (4) cooling the ceramic member to room temperature.

5. A process according to claim 4, wherein the molar ratio of the hydrogen gas to the nitrogen gas is in a range from 3:1 to 1:1.

6. A process according to claim 4, wherein said component to form the glass phase consisting essentially of $Al_2O_3$, $SiO_2$ and MnO is substantially composed of powders of $Al_2O_3$, $SiO_2$ and metallic manganese.

7. A metallizing paste according to claim 1, wherein said component to form a glass phase is present in an amount between 20–40% by weight and said metallic molybdenum powder is present in an amount between 60–80% by weight.

8. A metallizing paste according to claim 1, wherein said component to form a glass phase is present in an amount between 20–30% by weight and said metallic molybdenum powder is present in an amount between 70–80% by weight.

9. A metallizing paste according to claim 1, wherein said component to form a glass phase consists essentially of 8–20% by weight of $Al_2O_3$, 40–50% by weight of $SiO_2$ and 35-50% by weight of MnO.

10. A metallizing paste according to claim 1, wherein said component to form a glass phase consists essentially of 9–18% by weight of $Al_2O_3$, 40–46% by weight of $SiO_2$ and 38-50% by weight of MnO.

11. A metallizing paste according to claim 1, wherein said metallic molybdenum powder has an average particle size of $0.65\pm0.05$ $\mu$m.

* * * * *